United States Patent [19]
Furumura et al.

[11] Patent Number: 5,103,285
[45] Date of Patent: Apr. 7, 1992

[54] SILICON CARBIDE BARRIER BETWEEN SILICON SUBSTRATE AND METAL LAYER

[75] Inventors: Yuji Furumura; Fumitake Mieno, both of Kawasaki; Takashi Eshita, Inagi; Kikuo Itoh, Yokohama; Masahiko Doki, Sagamihara, all of Japan

[73] Assignee: Fujitsu Limited, Kawasaki, Japan

[21] Appl. No.: 286,611

[22] Filed: Dec. 19, 1988

[30] Foreign Application Priority Data

Dec. 17, 1987 [JP] Japan .................. 62-317398

[51] Int. Cl.$^5$ ............................ H01L 23/48
[52] U.S. Cl. ..................... 357/68; 357/23.1; 357/63; 357/65; 357/71
[58] Field of Search ........... 357/61, 65, 63, 68, 357/23.1; 437/100; 148/DIG. 148

[56] References Cited

U.S. PATENT DOCUMENTS

| | | | |
|---|---|---|---|
| 3,794,516 | 2/1974 | Engeler et al. | 357/61 |
| 4,722,913 | 2/1988 | Miller | 357/61 |
| 4,757,028 | 7/1988 | Kondoh et al. | 437/100 |
| 4,855,254 | 8/1989 | Eshita et al. | 148/DIG. 148 |

FOREIGN PATENT DOCUMENTS

| | | |
|---|---|---|
| 3632209 | 9/1986 | Fed. Rep. of Germany . |
| 63-136568 | 6/1988 | Japan .................. 357/61 |

OTHER PUBLICATIONS

Kimura et al., "Effect of Mixing Ions on the Formation Process of B-SiC Fabricated by Ion Beam Mixing," *Thin Solid Films,* 157 (1988), pp. 117–127.
T. Sugii et al. "Si Heterojunction Bipolar Transistors with Single-Crystalline β-SiC Emitters" J. Electrochem. Soc. Solid-State Science and Technology, vol. 134, No. 10, Oct. 1987, pp. 2545–2549.
F. Mieno et al. "Selective Doped Polysilicon Growth" J. Electrochem. Soc. Solid-State Science and Technology, Nov. 1987, vol. 134, No. 11, pp. 2862–2867.
F. T. J. Smith, "Wilicon charge-handling device employing SiC electrodes", Research Disclosure, No. 173, Sep. 1978, pp. 36–39, Abstract No. 17353.

*Primary Examiner*—Andrew J. James
*Assistant Examiner*—Courtney A. Bowers
*Attorney, Agent, or Firm*—Staas & Halsey

[57] ABSTRACT

A silicon carbide layer between a silicon substrate or layer and a metal layer because silicon carbide has many properties similar to those of silicon, has a very slow diffusion rate of a metal through the silicon carbide, or prevents a diffusion of a metal into the silicon, and can be deposited by CVD, which has an advantage of a good coverage over a step portion such as a contact window.

8 Claims, 3 Drawing Sheets

SILICON CARBIDE BARRIER BETWEEN SILICON SUBSTRATE AND METAL LAYER

BACKGROUND OF THE INVENTION

1. Field of the Invention

The present invention relates to a semiconductor device and a process for manufacturing such a device. More specifically the present invention relates to a silicon carbide barrier layer formed between a silicon substrate and a metal layer.

2. Description of the Related Art

Most semiconductor integrated circuits (IC's) are made by using a silicon wafer or substrate in which doped regions, i.e., regions wherein an impurity is diffused or ions are implanted, are formed to make the region electrically conductive or to form a pn junction, etc., and aluminum is usually used for forming a wiring or interconnection pattern in contact with or electrically connected to such doped regions in a silicon substrate. To increase the density and speed of operation of IC's, doped regions are made much smaller, and often, shallower. For example, a typical NMOS transistor has source and drain doped regions having a depth of about 0.3 to 0.35 $\mu$m and a channel length of about 1 to 2 $\mu$m. To shorten the channel length to, for example, about 0.7 to 0.8 $\mu$m, the depth of the source and drain regions must be less than 0.1 $\mu$m, since the threshold voltages $Vt_{TH}$ of the source and drain are remarkably decreased due to the shortened channel length.

This causes a problem of an extraordinary diffusion of aluminum into a silicon substrate, particularly through crystal defects, thus destroying a pn junction formed between the doped region and the silicon substrate. This extraordinary diffusion of aluminum occurs easily during heat treatment process steps, even if only at a relatively low temperature, which often must be used during the manufacture of IC's, and as a result, it is not easy to obtain a reliable device having a shallow doped region in a silicon substrate.

To prevent this diffusion of aluminum into a silicon substrate, it has been proposed to insert a barrier metal layer made of tungsten, molybdenum, etc. between the silicon substrate and the aluminum electrode or wiring layer, but such a barrier metal layer is not satisfactory because the barrier metals used still react with silicon although the reactivity thereof is smaller than that of the aluminum. Moreover, a barrier metal layer is typically formed by sputtering or evaporation, but sputtering and evaporation do not provide a good coverage over a step portion of a substrate, despite the circumstance that most wiring layers or wiring layers are brought into contact with the silicon substrate through a window portion of an insulating layer formed on the silicon substrate, i.e., through a step portion. This poor coverage of the barrier metal layer sometimes causes problems.

Therefore, there is a demand for a barrier which will prevent the diffusion of aluminum into a silicon substrate and can be applied with good coverage at a step portion.

Moreover, it is not easy to form a shallow doped region having, typically, a depth of less than 100 nm, with a high reliability, and therefore, a process for forming a shallow doped region in a silicon substrate with a high reliability is also needed.

A process, per se, is known in which silicon is heated in an atmosphere containing carbon at 1,000° C. to change the silicon to silicon carbide.

A process is also known in which silicon carbide is deposited on a substrate from silane, propane and hydrogen at 1,500°-1,700° C. (for example, H. Matunami, "SILICON CARBIDE FILMS", *THIN FILMS FROM FREE ATOMS AND PARTICLES*, 1985, Academic Press Inc. pp 301-324). It is also known that silicon carbide can be made electrically conductive by doping phosphorus in the silicon carbide (see F. Mieno eta, "Selective Doped Polysilicon Growth", Journal of the Electrochemical Society, Vo. 134, No. 11, November 1987, pp 2,862-2,867). These processes, however, do not concern the formation of a silicon carbide layer between a metal layer and a silicon substrate as a barrier layer and do not teach that a silicon carbide layer can be used as a barrier layer for preventing the diffusion of metal into a silicon.

SUMMARY OF THE INVENTION

According to the present invention, there is provided a semiconductor device having a structure comprising: a silicon substrate having a top surface; a doped region in the silicon substrate adjacent to the top surface of the silicon substrate; a silicon carbide layer formed adjacent to the top surface of the silicon substrate in or above the doped region of the silicon substrate; and a metal layer formed on the silicon carbide layer and electrically connected to the doped region in the silicon substrate.

The inventors surprisingly found that a silicon carbide layer can be used as a barrier layer between a silicon substrate and a metal layer since the silicon carbide layer effectively prevents the diffusion of a metal into the silicon substrate and has characteristics or properties similar to those of silicon, including the lattice constant, the electrical conductivity afforded by the dopant; (i.e., the same dopant at the same concentration provides the same conductivity-type and a similar conductivity in the silicon carbide layer as in the substrate), and the thermal expansion coefficient, e.g., $5.8 \times 10^{-6}$ (1,000° C.), and therefore, is suitable for insertion between the silicon substrate and the metal layer.

Such a barrier layer of silicon carbide may be formed by a carbonization of the top surface of a silicon substrate or by depositing a silicon carbide layer on a silicon substrate from a gas phase (CVD).

Thus, as an embodiment of the present invention, there is provided a semiconductor device having a structure comprising: a silicon substrate having a top surface; a carbonized silicon layer formed in the silicon substrate adjacent to the top surface thereof; a doped region formed at least in the carbonized silicon layer adjacent to the top surface of the silicon substrate; and a metal layer formed on the carbonized silicon layer and electrically connected to the doped region.

Correspondingly, there is provided a process for manufacturing a semiconductor device, said process comprising the steps of: preparing an silicon substrate having a mask thereon, the mask having an opening in which a top surface of said silicon substrate is exposed; heating said silicon substrate in a carbon-containing gas atmosphere to form a carbonized silicon layer in said silicon substrate adjacent to the top surface thereof under said opening; doping an impurity in to said silicon substrate, at least in a part of said carbonized silicon layer; and forming a metal layer on said carbonized silicon layer, said metal layer being electrically connected to said doped region.

In this embodiment of the present invention, the inventors also found that the diffusion coefficient of a dopant in a silicon carbide layer is remarkably smaller than that in silicon, and therefore, a desirable shallow diffused, or doped, region can be easily formed using a silicon carbide layer adjacent to the top surface of a silicon substrate by diffusing a dopant through the silicon carbide layer into the silicon substrate.

In another embodiment of the present invention, there is provided a semiconductor device having a structure comprising: a silicon substrate having a top surface; a doped region formed in the silicon substrate adjacent to the top surface thereof; a doped silicon carbide layer formed on the top surface of the silicon substrate and in contact with the doped region of the silicon substrate; and a metal layer formed on the silicon carbide layer and electrically connected to the doped region in the silicon substrate.

Also, there is correspondingly provided a process for manufacturing a semiconductor device having a structure as above, said process comprising the steps of: preparing a silicon substrate having a doped region in the silicon substrate adjacent to a top surface thereof; depositing a doped silicon carbide layer on the silicon substrate and in contact with the doped region; and forming a metal layer on said doped silicon carbide layer, said metal layer being electrically connected to said doped region in said silicon substrate through said doped silicon carbide layer.

DESCRIPTION OF THE PREFERRED EMBODIMENTS

Figure 1A:
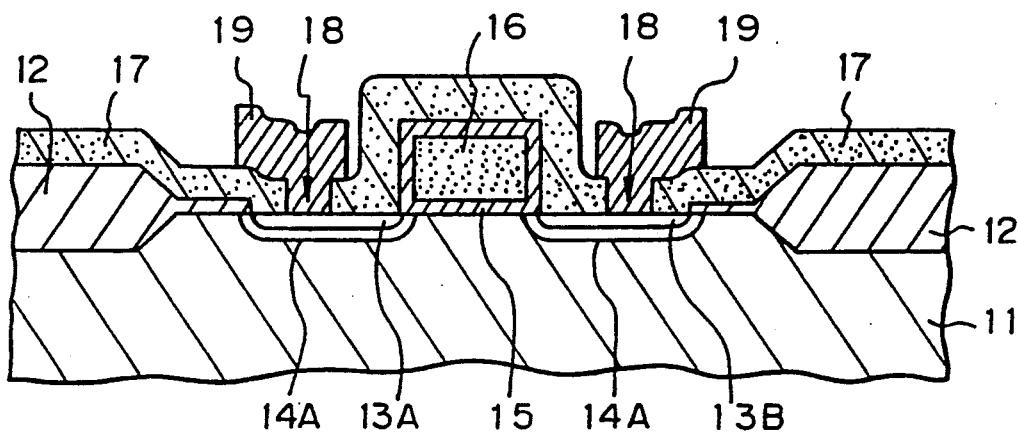
FIGS. 1A to 1C are sectional views of an NMOS transistor during the steps of manufacturing same.

FIG. 1A illustrates an NMOS transistor as an example of a semiconductor device according to the present invention. In FIG. 1A, the reference numeral 11 denotes a p-type silicon substrate (boron-doped at a concentration of $2 \times 10^{-5}$ cm$^{-3}$), 12 a field oxide layer for element isolation, 13A and 13B carbonized silicon layers, 14A and 14B n+-type source and drain regions, 15 a gate oxide film, 16 a gate electrode of a doped polysilicon, 17 a PSG insulating layer, 18 contact windows, and 19 wiring layers of aluminum. The process for manufacturing this NMOS transistor is described with reference to FIGS. 1A to 1C.

Figure 1B:
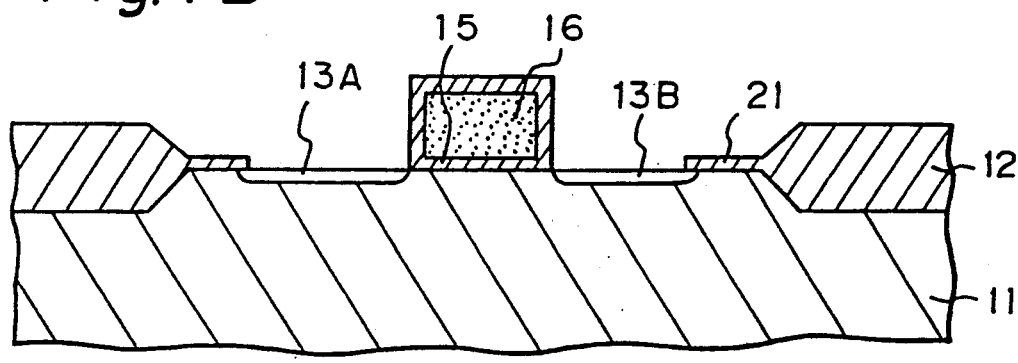

Referring to FIG. 1B, a p-type silicon substrate 11 is provided with a thick oxide layer 12 for element isolation. A thin oxide layer 21 is formed on a region where an element or an FET is to be formed, and polysilicon is deposited, patterned, and oxidized at the surface thereof to form a gate electrode 16.

Portions of the thin oxide layer 21 where the source and drain are to be formed are then etched away.

Figure 2:
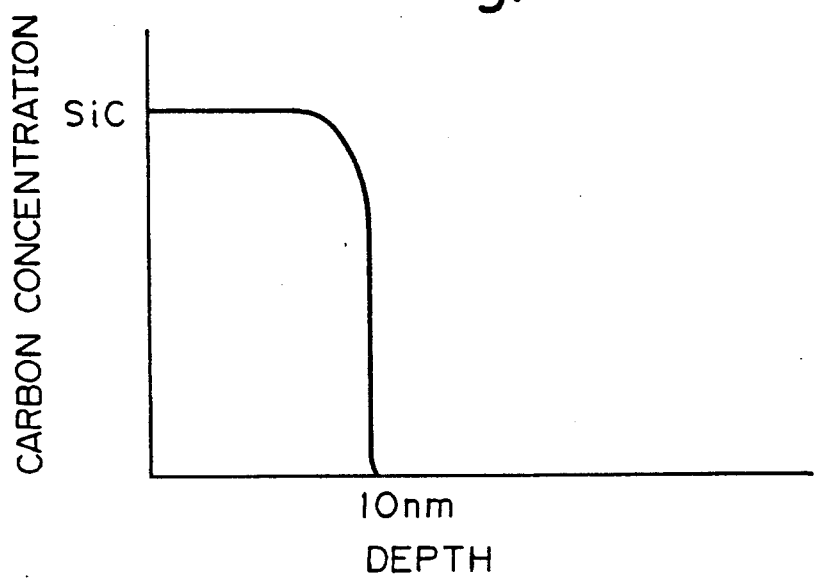
FIG. 2 shows a depth profile of the carbon concentration formed on a carbonized silicon layer in a silicon substrate.

The substrate is heat treated under a gas flow of a hydrocarbon such as acethylene, ethylene and propane, preferably with hydrogen at a temperature of from about 700° C. to below the melting point of the silicon, to carbonize the exposed surface portions 13A and 13B of the silicon substrate 11. The atmosphere of this heat treatment for carbonization requires a gaseous hydrocarbon preferably in the form of a gas flow to remove undesirable reaction products from above the surface of the silicon substrate to be carbonized. Generally, an admixture of hydrogen is preferably used to clean the surface of the silicon substrate or to remove undesirable oxide or metal on the surface of the silicon substrate, although this hydrogen is theoretically unnecessary if the surface of a silicon substrate is sufficiently clean. A typical ratio of hydrocarbon to hydrogen is 100:0.1-10 by flow rate, although the hydrogen can be reduced to zero according to circumstances. The flow rate of the gas is not limited but may be, for example, 10 to 1,000 cc/min. The temperature is not particularly limited as long as it is high enough for the hydrocarbon to react with silicon but is lower than the melting point of the silicon. The temperature at which a hydrocarbon will react with silicon is usually above 700° C., but may be lowered by using a plasma, etc. Generally, although a higher temperature accelerates the reaction, it increases the thickness of the carbonized layer. The pressure used is not limited and any of a reduced pressure, atmospheric pressure, and a superatmospheric pressure may be used. As an example, under a gas flow of hydrogen and propane ($C_3H_8$) with a flow rate of 70 cc/min and a ratio of $H_2/C_3H_8$ of 100:1 by volume, the silicon substrate as shown in FIG. 1A is heated at about 900° C. and 400 Pa for 20 minutes and carbonized silicon layers 13A and 13B having a thickness of about 10 nm are obtained. Generally, a carbonized silicon layer preferably has a thickness of up to 20 nm, more preferably less than 10 nm. FIG. 2 shows a typical concentration profile of carbon in the carbonized silicon layers 13A and 13B thus formed, which is obtained by SIMS measurement. From FIG. 2, it is seen that complete silicon carbide (SiC) is formed in the layers 13A and 13B and that there is little diffusion of carbon atoms into the silicon substrate outside the layers 13A and 13B.

Figure 1C:
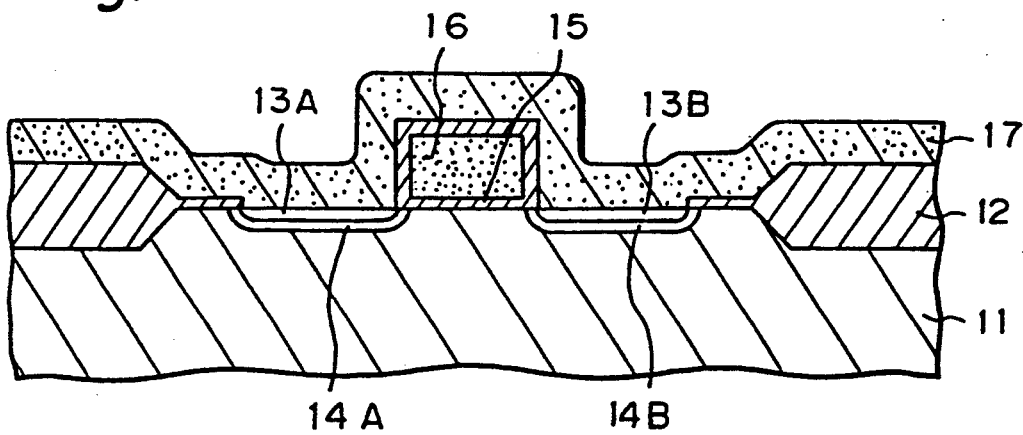

Referring to FIG. 1C, a PSG layer 17 is deposited over all of the silicon substrate, which is heat treated, for example, at 100° C. for 30 minutes. This treatment causes a diffusion of the phosphorus (P) in the PSG layer 17 into the silicon carbide layers 13A and 13B and the p-type silicon substrate 11, to form n-type diffused or doped regions 14A and 14B having a depth of about 100 nm, which n+-type diffused or doped regions, i.e., having a high concentration of phosphorus, are formed only within the carbided silicon layers 13A and 13B, i e., having a depth of less than 10 nm.

Figure 3:
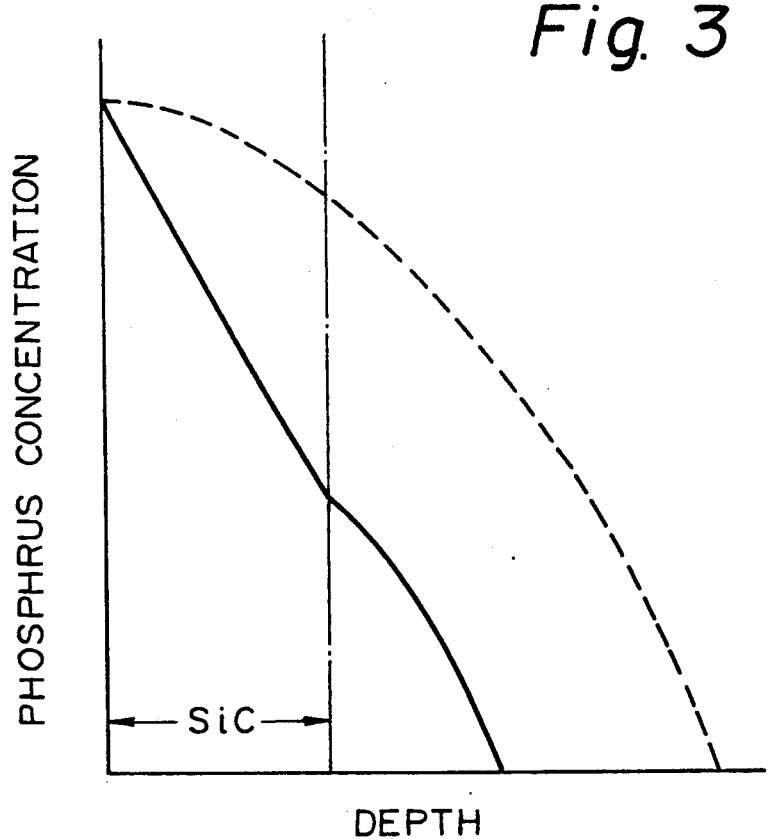
FIG. 3 shows depth profiles of phosphorous concentrations in different silicon substrates respectively having and not having a carbonized silicon layer.

As before noted, the above diffusion of the phosphorus in the carbonized silicon layer, i.e., the silicon carbide layer, is very slow in comparison with the diffusion of the phosphorus in silicon, and as a result, the diffusion of the phosphorus in the silicon carbide at a shallow depth is easily controlled. In the above example, the depth of the diffused layers 14A and 14B is about 100 nm. It is generally considered that a diffused layer having a depth of less than about 100 nm is a shallow diffusion layer, but, if desired, the depth of the diffused layers 14A and 14B can be easily made shallower, for example, from 10 nm to 80 nm, by changing the diffusion conditions. A diffused layer having a depth of about 10 to 200 nm may be generally utilized. It is also possible to reduce the depth of the diffused layers 14A and 14B to within the depth of the carbonized layer, for example, to 10 nm or less. FIG. 3 shows a typical profile of the phosphorus concentration of the diffused layers 14A and 14B in the direction of the depth (the solid line). It can be seen in FIG. 3 that the concentration of the phosphorus is remarkably reduced as a function of the depth of the carbonized silicon layer, although there is little reduction of the concentration of the phosphorus near the surface of a silicon substrate if the silicon substrate does not include a carbonized silicon layer (as shown by the broken line). This large decline of the concentration of the phosphorus in relation to the depth in the carbonized silicon layer is due to the slow diffusion rate of the phosphorus in the carbonized silicon layer, and thus preferably the depth of the diffused layer is kept shallow. In the above example, the depth of the diffused layers 14A and 14B is made shallow enough to fit a channel length of as short as 0.7–0.8 μm and to allow the pn junction formed at the periphery of each of the diffused layer to be in the silicon substrate, i.e., below the carbonized silicon layers 14A and 14B. This is because the characteristics of a pn junction in the silicon substrate are superior to those of a pn junction in the carbonized silicon layer, although a pn junction in the carbonized silicon layer may be used.

Although phosphorus is used in the above example, arsenide, etc., also may be used to form an n-type diffused layer in the carbonized silicon, and boron, etc., may be used to form a p-type diffused layer in the carbonized silicon. It is also possible to form a doped layer in a carbonized silicon by ion implantation. It is an advantage of silicon carbide, or carbonized silicon that a diffusion of the same impurity gives the silicon carbide and the silicon the same type of conductivity.

Referring to FIG. 1A, contact windows 18 are formed in the PSG layer 17 and an aluminum wiring layer 19 is formed on the PSG layer 17 including the contact windows 18, to bring the aluminum wiring layer into contact with the diffused source and drain layers, or regions, 14A and 14B.

Accordingly, an NMOS transistor having shallow source and drain regions and a correspondingly short channel length is manufactured. In the process of manufacturing an IC, heat treatments are often inevitable even after completion of the manufacture of an NMOS. For example, a heat treatment at about 900°–1,000° C. is carried out to make the step of the patterned BPSG layer even by causing the BPSG to flow. In another example, forming a PSG layer on an aluminum wiring layer as an insulating requires a heat treatment temperature of about 420° C. These heat treatments, in the prior art, caused aluminum of a wiring layer in contact with a silicon substrate to diffuse into the silicon substrate through crystal defects, etc., and as a result, a diffused layer formed in the silicon substrate adjacent to the surface thereof and having a depth of about 100 nm or less was damaged or broken by the extraordinary diffusion of the aluminum, penetrating through the diffused layer into the silicon substrate. Therefore, a depth of at least about 250 nm was required for a diffused layer in the prior art. In contrast, in accordance with the present invention, even under the heat treatments as mentioned above, i.e., at about 900°–1,000° C. or at about 420° C., the diffused layers 14A and 14B having a depth of about 100 nm are not damaged, since it is difficult for the aluminum to diffuse into the carbonized silicon layers 13A and 13B, and therefore, the carbonized silicon layers 13A and 13B act as barriers against the aluminum diffusion into the silicon substrate 11.

Another example of the present invention is described with reference to FIGS. 4A to 4C. This example is of a bipolar transistor having a shallow emitter and a barrier layer of silicon carbide formed by CVD.

Figure 4A:
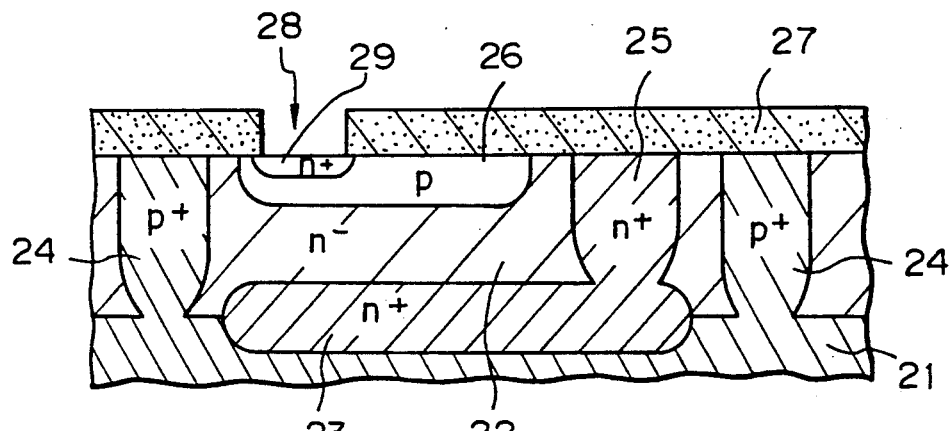
FIGS. 4A to 4C are sectional views of a bipolar transistor during a step of manufacturing same.

Referring to FIG. 4A, an epitaxial layer 22, n$^-$-type, is formed on a silicon substrate 21 and an n$^+$-type diffused layer 23 is buried between the silicon substrate 21 and the epitaxial layer 22. The epitaxial layer 22 is divided into element-forming regions by p$^+$-type doped isolation regions 24. An n$^+$-type doped region 25 is a collector contact region and a p-type doped region 26 is a base region. On the top surface of the epitaxial layer 22, an insulation layer 27 having a window 28 is formed. Using the insulating layer 27 as a mask, arsenide ions are implanted into the epitaxial layer 22 through the window 28, to form an n$^+$-type emitter region 29 which is having a depth of about 100 nm. The base region 26 has a depth of about 200 nm.

Figure 4B:
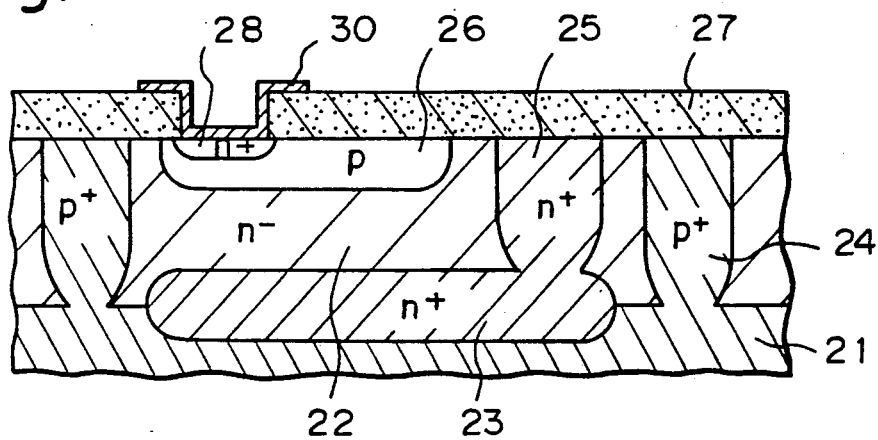

Referring to FIG. 4B, an n$^+$-type doped silicon carbide layer 30 is formed by CVD. For example, the silicon substrate or the silicon wafer is mounted on a graphite susceptor in a quartz reactor, which is evacuated at a rate of $8 \times 10^3$ l/min. Into the reactor, a gas mixture of hydrogen (7 l/min), SiH$_4$ (100 cc/min), C$_2$H$_2$ (40–60 cc/min) and PH$_3$ (5–10 cc/min) is supplied and the wafer is heated to 800°–900° C. by heating the susceptor by a work coil at 8 kHz and 30 kW, at a pressure in the reactor of 400 Pa. Under these conditions, silicon carbide doped with phosphorus at a carrier concentration of $5 \times 10^{20}$/cm$^3$ is deposited at a rate of 30 nm/min, and thus a barrier layer 30 of an n$^+$-type doped silicon carbide is formed in the window 28 and on the insulating layer 27, having a thickness of 30–50 nm and a specific resistance of $1-3 \times 10^{-3}$ Ωcm.

Figure 4C:
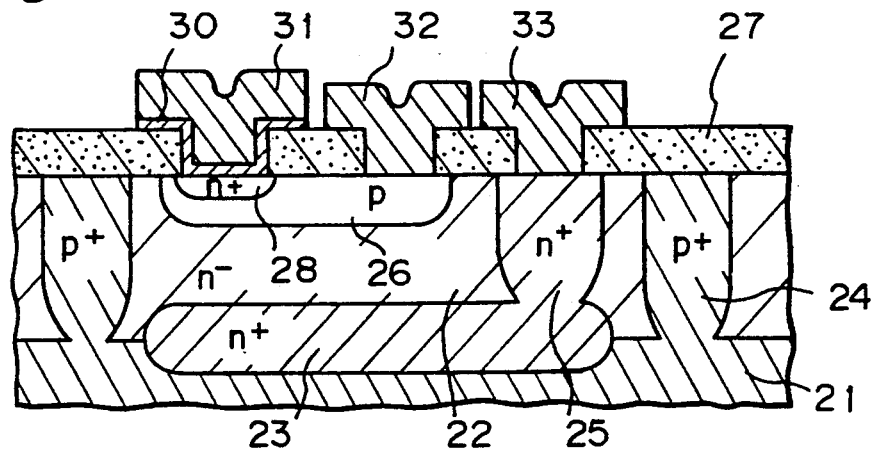

Referring to FIG. 4C, after contact windows for the base and collector electrodes are formed, emitter, base and collector electrodes 31, 32 and 33 are formed of aluminum.

The thus manufactured bipolar transistor can resist all heat treatments, although having a shallow emitter region 28, since the barrier layer 30 of CVD-formed silicon carbide acts as a barrier for preventing extraordinary diffusion into the emitter region 28 or the silicon.

In this example, the doped silicon carbide layer 30 may be formed by any process for depositing a doped silicon carbide layer. Such a process generally involves a chemical reaction of a silicon source gas such as silane and a carbon source gas such as a hydrocarbon, together with a doping gas such as phosphine, arsine and borane, at an elevated temperature. The deposition of a silicon carbide is advantageous in that it is formed by a CVD process and not by sputtering or evaporation, and therefore, the deposited silicon carbide layer has a good coverage over the step portion, for example, in the contact window, and in that the silicon carbide material has properties very similar to those of silicon, for example, the thermal expansion coefficient and therefore, the barrier layer of a doped silicon carbide does not adversely affect the properties of the contact between a metal such as aluminum and a doped region in a silicon substrate. Further, the emitter region 28 may be formed not only by diffusion but also by ion implantation, and the ion implantation may be effected even through the silicon carbide barrier layer 30 after the deposition thereof. Note, it is obvious that many variations are possible when manufacturing a bipolar transistor. The silicon carbide barrier layer of the present invention differs from a doped silicon carbide layer of an emitter or a collector of a vertical bipolar transistor in which the silicon carbide layer is deposited on a silicon substrate, by the fact that the barrier layer is thinner than the emitter or collector layer; is deposited in a contact window;, and forms a contact to a doped region formed in the silicon substrate, the doped region being selectively formed adjacent to the top surface of the silicon substrate, and the silicon substrate having another doped region adjacent to the top surface of the silicon substrate and separated from said doped region in contact with the barrier layer.

Although the present invention is described with reference to examples of an NMOS transistor and a bipolar transistor, the present invention is applicable to any contact between silicon or a doped region in silicon and a metal layer of aluminum, tungsten or any other metal that would be extraordinarily diffused into the silicon through crystal defects, etc.

We claim:

1. A semiconductor device comprising:
   a silicon substrate having a top surface;
   an insulating layer formed on the top surface of the silicon substrate and having an opening extending transversely therethrough to the top surface of the silicon substrate, the opening having a first periphery and a corresponding first area at the top surface of the silicon substrate and through which a corresponding first area portion of the top surface of the substrate is exposed;
   a carbonized silicon layer formed in the silicon substrate, extending from, and transversely to, the top surface of the substrate and to a first depth therein, the carbonized silicon layer having a second periphery and a corresponding second area at the top surface of the silicon substrate, the second periphery and corresponding second area respectively encompassing and being larger than the first periphery and corresponding first area of the opening, the periphery of the carbonized silicon layer thereby extending under a portion of the insulating layer adjacent to and surrounding the first periphery of the opening therein;
   a doped region formed in the silicon substrate and extending from, and transversely to, the top surface of the silicon substrate and through the carbonized silicon layer to a second depth in the silicon substrate, the second depth being greater than the first depth, and the doped region having a third periphery and corresponding third area at the top surface of the silicon substrate, the third periphery and corresponding third area respectively encompassing and being larger than the second periphery and corresponding second area; and
   a conducting material layer formed on and contacting the carbonized silicon layer at the exposed, first area portion of the top surface of the silicon substrate and electrically connected to the doped region.

2. A device according to claim 1, wherein the first depth, of said carbonized silicon layer, is up to 20 nm.

3. A device according to claim 2, wherein the second depth of said doped region is less than 200 nm.

4. A device according to claim 1, wherein said doped region comprises one of the source and drain regions of a field effect transistor.

5. A semiconductor device as recited in claim 1, wherein the material of the conducting material layer is a metal.

6. A semiconductor device as recited in claim 5, wherein:
   the carbonized silicon layer affords a barrier to diffusion of metal from the conducting material layer into the doped region.

7. A semiconductor device as recited in claim 1, wherein:
   the doped region is formed by the diffusion of a dopant into and through the carbonized silicon layer to the second depth in the silicon substrate;
   the silicon substrate has a first diffusion coefficient with respect to the dopant; and
   the carbonized silicon layer has a second diffusion coefficient, substantially smaller than the first diffusion coefficient, with respect to the dopant, and thereby affords selective control of the second depth of the doped region relatively to the first depth of the carbonized silicon layer.

8. A semiconductor device as recited in claim 1, wherein:
   the doped region is formed by the diffusion of a dopant into and through the carbonized silicon layer to the second depth in the silicon substrate;
   the silicon substrate has a first diffusion coefficient with respect to the dopant;
   the carbonized silicon layer has a second diffusion coefficient, substantially smaller than the first diffusion coefficient, with respect to the dopant; and
   the dopant has a first concentration profile in the carbonized silicon layer, and thus extending from the top surface of the silicon substrate to the first depth therein, and a second concentration profile in the substrate, extending from the first to the second depth therein, each concentration profile representing the decrease in the amount of dopant as a function of the depth of diffusion of the dopant into the substrate and the first concentration profile representing a greater reduction in the amount of the dopant as a function of the diffusion depth than the second concentration profile.

* * * * *

UNITED STATES PATENT AND TRADEMARK OFFICE
CERTIFICATE OF CORRECTION

PATENT NO. : 5,103,285
DATED : April 7, 1992
INVENTOR(S) : Yuji FURUMURA et al.

It is certified that error appears in the above-identified patent and that said Letters Patent is hereby corrected as shown below:

On title page, item [56] References Cited - OTHER PUBLICATIONS:

line 1,   fourth publication, change "Wilicon" to --Silicon--.

Col. 1,   line 54,   change "wiring layers" to --electrodes--.

Col. 2,   line 19,   before "metal" insert --a--, and after "into" delete "a";
        line 34,   after "layer" insert --,--;
        line 60,   change "an" to --a--;
        line 66,   change in to" to --into--.

Col. 3,   line 37,   change "formed on" to --in--, and change "in" to --formed on--.

Col. 5,   line 18,   after "$\mu$m" insert --,--;
        line 20,   change "layer" to --layers 14A and 14B--;
  line 21, change "layers 14A and 14B" to --layer--
        line 51,   after "insulating" insert --layer--.

Col. 7,   line 7,   delete ",".

Signed and Sealed this

Sixteenth Day of November, 1993

Attest:

BRUCE LEHMAN

*Attesting Officer*      *Commissioner of Patents and Trademarks*